United States Patent
Kim et al.

(10) Patent No.: US 10,727,430 B2
(45) Date of Patent: Jul. 28, 2020

(54) ORGANIC LIGHT EMITTING DIODE

(71) Applicant: LG Chem, Ltd., Seoul (KR)

(72) Inventors: Hwakyung Kim, Daejeon (KR); Chang Hwan Kim, Daejeon (KR); Minseung Chun, Daejeon (KR); Seongmi Cho, Daejeon (KR); Dongheon Kim, Daejeon (KR); Wooyung Jung, Daejeon (KR)

(73) Assignee: LG Chem, Ltd. (KR)

( * ) Notice: Subject to any disclaimer, the term of this patent is extended or adjusted under 35 U.S.C. 154(b) by 357 days.

(21) Appl. No.: 15/541,098

(22) PCT Filed: Sep. 22, 2016

(86) PCT No.: PCT/KR2016/010580
§ 371 (c)(1),
(2) Date: Jun. 30, 2017

(87) PCT Pub. No.: WO2017/052225
PCT Pub. Date: Mar. 30, 2017

(65) Prior Publication Data
US 2017/0352828 A1    Dec. 7, 2017

(30) Foreign Application Priority Data
Sep. 25, 2015 (KR) .................. 10-2015-0136642

(51) Int. Cl.
*H01L 51/50* (2006.01)
*H01L 51/00* (2006.01)
*C09K 11/06* (2006.01)

(52) U.S. Cl.
CPC .......... *H01L 51/5004* (2013.01); *C09K 11/06* (2013.01); *H01L 51/006* (2013.01);
(Continued)

(58) Field of Classification Search
None
See application file for complete search history.

(56) References Cited

U.S. PATENT DOCUMENTS

| 6,720,090 B2 * | 4/2004 | Young | C09K 11/06 |
| | | | 252/301.16 |
| 2004/0076853 A1 * | 4/2004 | Jarikov | C09K 11/06 |
| | | | 428/690 |

(Continued)

FOREIGN PATENT DOCUMENTS

| EP | 1221473 A1 | 7/2002 |
| JP | 2005158715 A | 6/2005 |

(Continued)

OTHER PUBLICATIONS

Noguchi Yutaka et al: "Charge accumulation at organic semiconductor interfaces due to a permanent dipole moment and its orientational order in bilayer devices." Journal of Applied Physics. American Institute of Physics. US. vol. 111. No. 11. Jun. 5, 2012 (Jun. 5, 2012), pp. 114508-114508. XP012157743. ISSN: 0021-8979. DOI: 10.1063/1.4724349.

(Continued)

*Primary Examiner* — Vu A Nguyen
(74) *Attorney, Agent, or Firm* — Lerner, David, Littenberg, Krumholz & Mentlik, LLP

(57) ABSTRACT

An embodiment of the present invention discloses an organic light emitting diode comprising an organic layer consisting of one layer or more, which includes a transparent electrode, a reflective electrode provided facing the transparent elector, and a light emitting layer provided between the transparent electrode and the reflective electrode. Here, the light emitting layer includes two or more light emitting materials and is characterized in that the difference between the dipole moment value of one light emitting material and
(Continued)

the dipole moment value of another light emitting material from among the light emitting materials is 1.5 Debye or more.

16 Claims, 6 Drawing Sheets

(52) U.S. Cl.
CPC ...... *H01L 51/0052* (2013.01); *H01L 51/0058* (2013.01); *H01L 51/0061* (2013.01); *H01L 51/0072* (2013.01); *H01L 51/0073* (2013.01); *H01L 51/0074* (2013.01); *H01L 51/0081* (2013.01); *H01L 51/5024* (2013.01); *C09K 2211/1007* (2013.01); *C09K 2211/1011* (2013.01); *C09K 2211/1018* (2013.01); *H01L 51/5012* (2013.01); *H01L 2251/5384* (2013.01); *H01L 2251/55* (2013.01); *H01L 2251/552* (2013.01)

(56) References Cited

U.S. PATENT DOCUMENTS

| | | | |
|---|---|---|---|
| 2005/0088083 | A1 | 4/2005 | Seo et al. |
| 2005/0153163 | A1* | 7/2005 | Klubek ............... C09K 11/06 428/690 |
| 2011/0127510 | A1 | 6/2011 | Seo et al. |
| 2012/0199820 | A1 | 8/2012 | Ito et al. |
| 2014/0191227 | A1* | 7/2014 | Inoue ............... H01L 51/5016 257/40 |
| 2015/0031900 | A1* | 1/2015 | Kawakami ........ H01L 51/0054 549/457 |
| 2015/0280158 | A1 | 10/2015 | Ogiwara et al. |

FOREIGN PATENT DOCUMENTS

| | | |
|---|---|---|
| JP | 2007520061 A | 7/2007 |
| JP | 2012231134 A | 11/2012 |
| JP | 2014075249 A | 4/2014 |
| JP | 2015018883 A | 1/2015 |
| JP | 2015037168 A | 2/2015 |
| KR | 20150077587 A | 7/2015 |
| TW | 200527962 A | 8/2005 |
| TW | 201133976 A | 10/2011 |
| TW | 201219539 A | 5/2012 |

OTHER PUBLICATIONS

Extended European Search Report including Written Opinion for EP16848950.8 dated Apr. 29, 2019.
Taiwanese Search Report for Application No. 105130712 dated Jan. 22, 2018.
Search Report from International Application No. PCT/KR2016/010580, dated Jan. 12, 2017.
Bulovic, V., et al., "Tuning the color emission of thin film molecular organic light emitting devices by the solid state solvation effect." Chemical Physics Letters, vol. 308, Jul. 23, 1999, pp. 317-322.

* cited by examiner

[Figure 1]
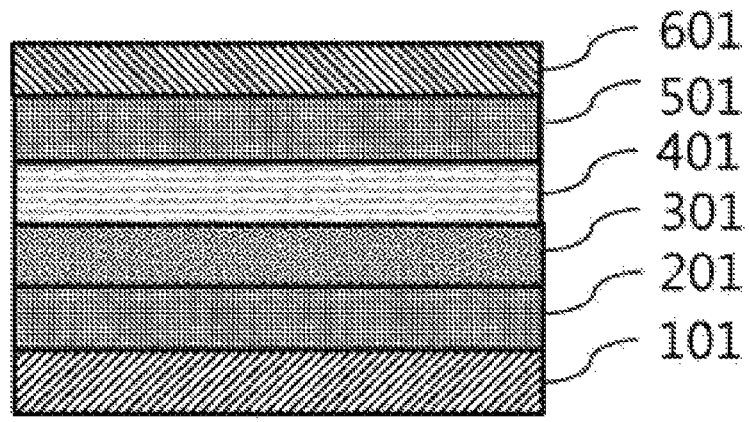
[Figure 2]
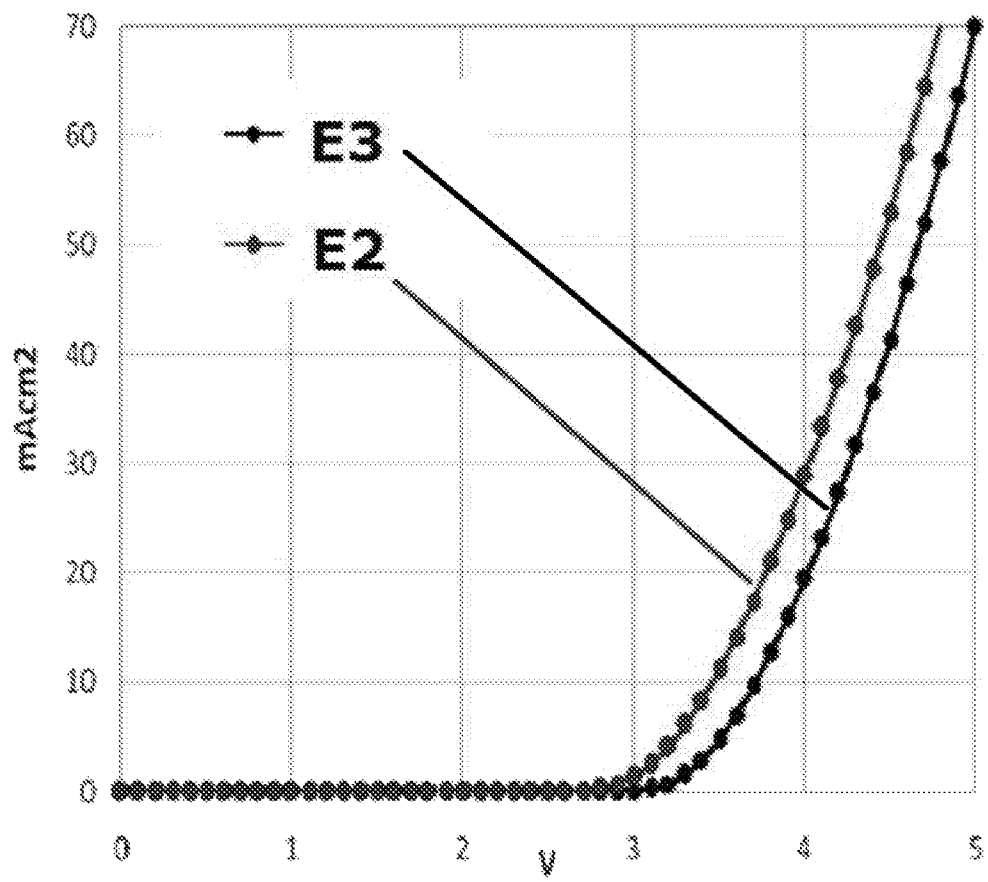

[Figure 3]
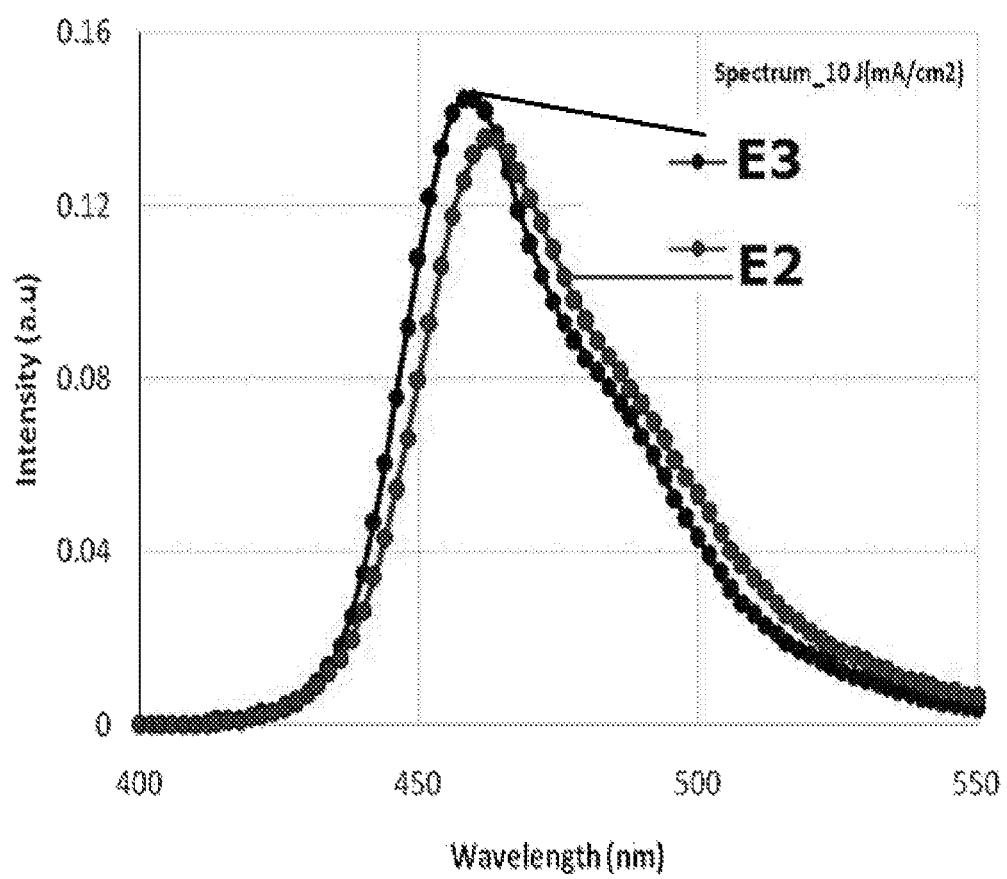

[Figure 4]
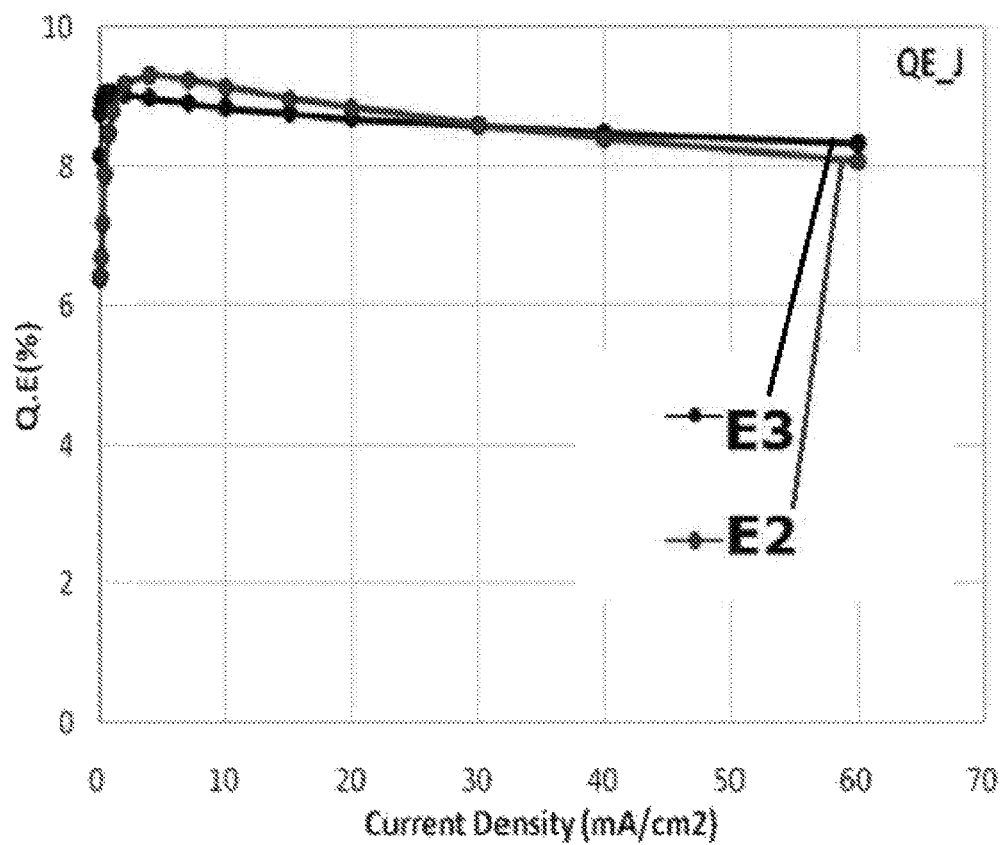

[Figure 5]
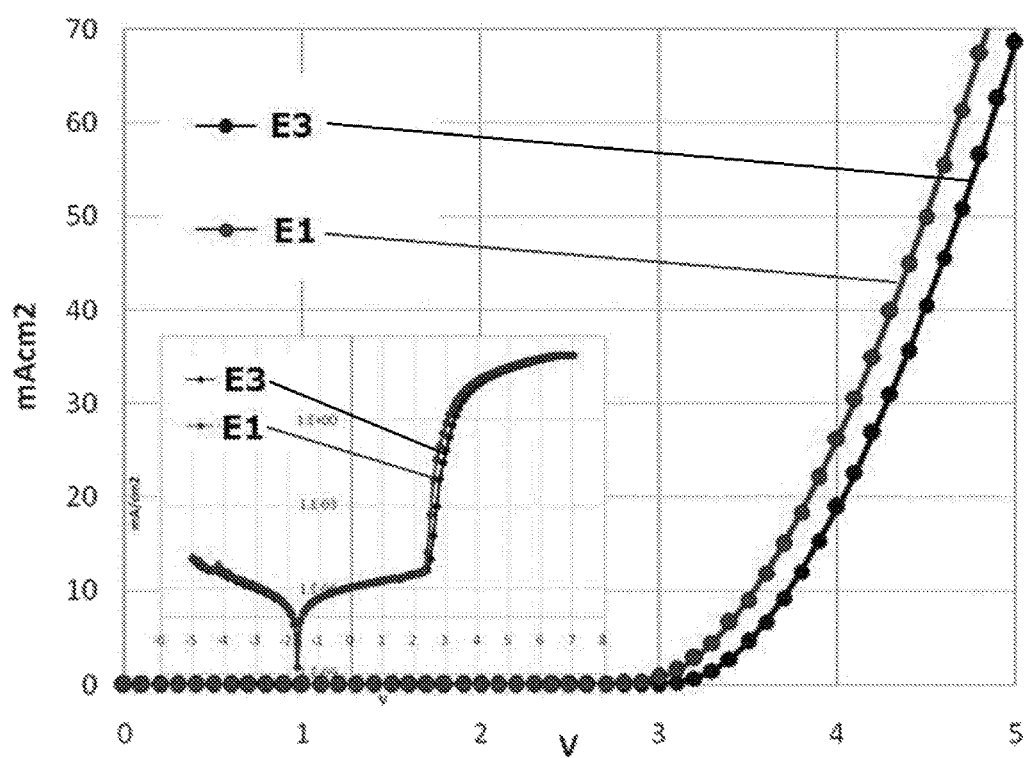

[Figure 6]
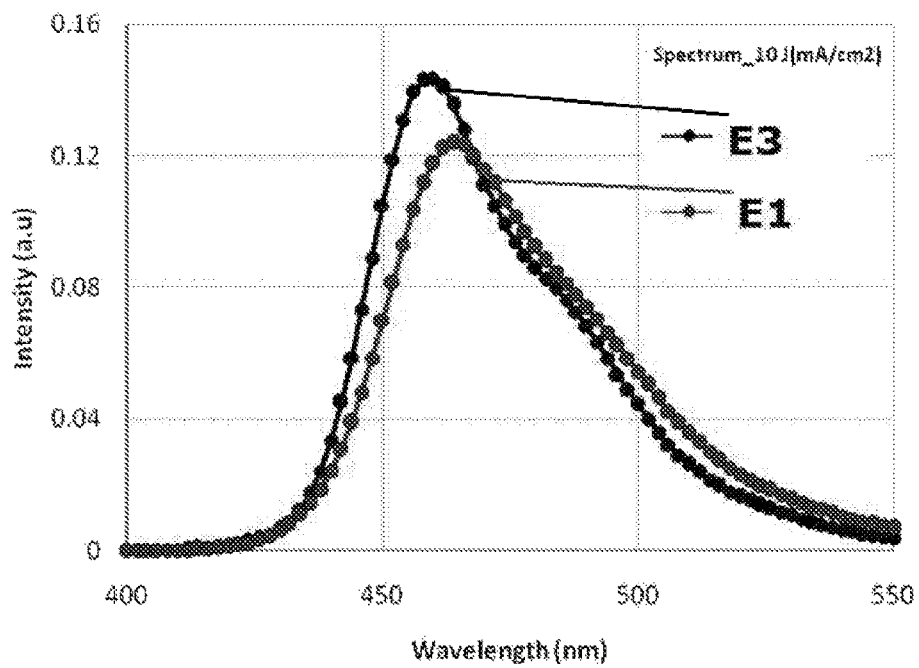
[Figure 7]
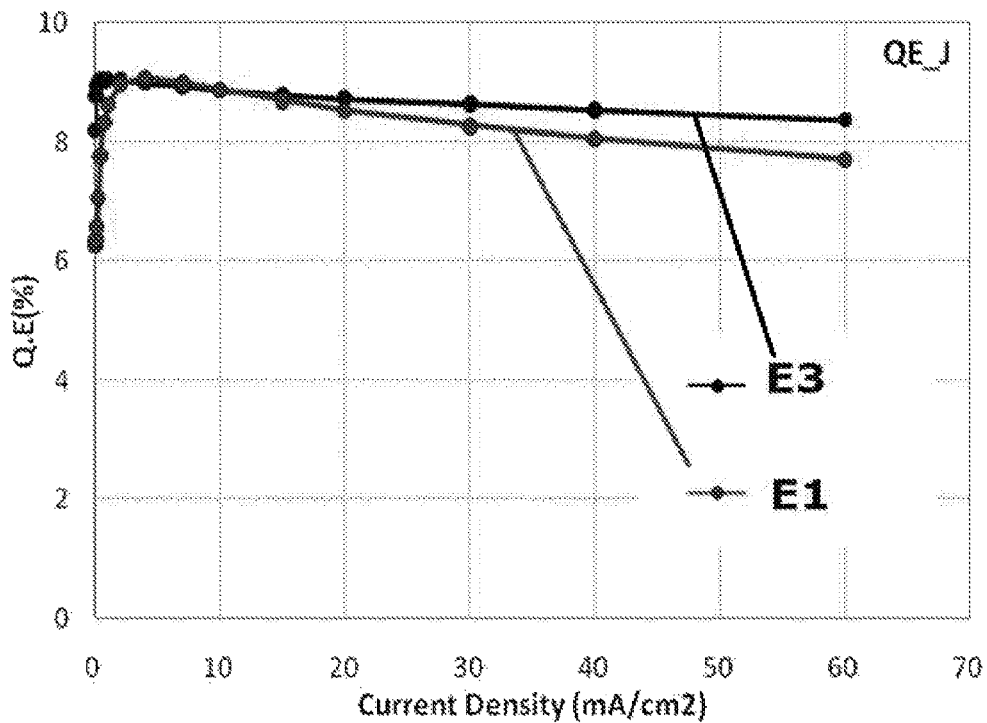

[Figure 8]
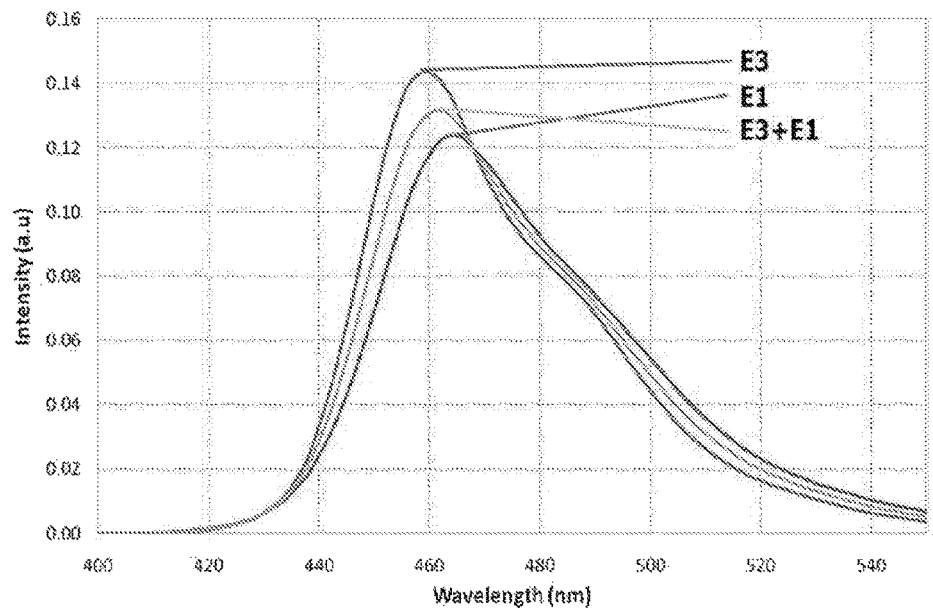
[Figure 9]
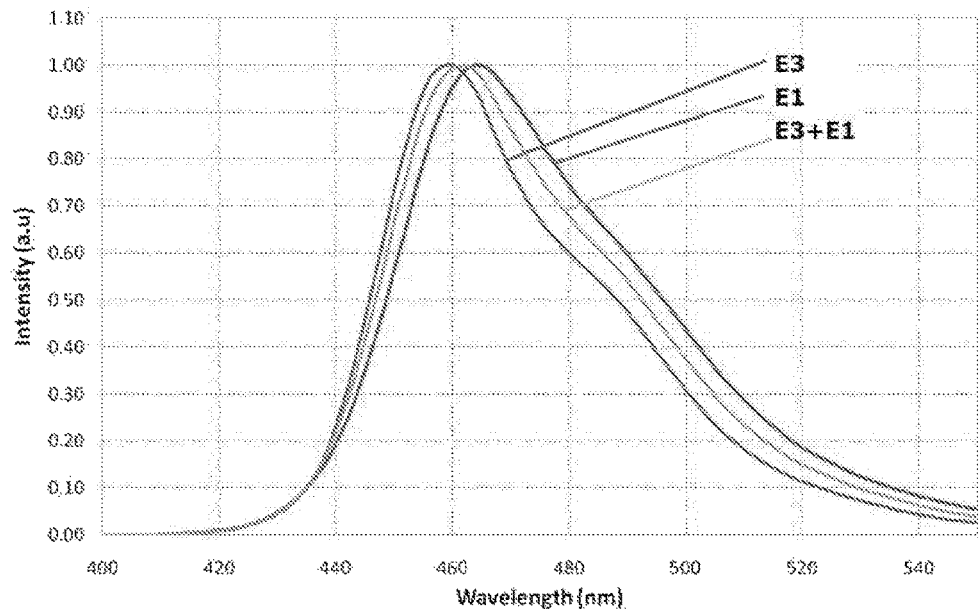

ORGANIC LIGHT EMITTING DIODE

CROSS-REFERENCE TO RELATED APPLICATION

This application is a national phase entry under 35 U.S.C. § 371 of International Application No. PCT/KR2016/010580, filed Sep. 22, 2016, which claims priority to Korean Patent Application No. 10-2015-0136642, filed Sep. 25, 2015, the disclosures of which are incorporated herein by reference.

TECHNICAL FIELD

The present specification relates to an organic light emitting diode.

BACKGROUND ART

An organic light emission phenomenon is one of the examples of converting current into visible rays through an internal process of a specific organic molecule. The principle of the organic light emission phenomenon is as follows.

When an organic material layer is disposed between an anode and a cathode, if voltage is applied between the two electrodes, electrons and holes are injected into the organic material layer from the cathode and the anode, respectively. The electrons and the holes which are injected into the organic material layer are recombined to form an exciton, and the exciton falls down again to the ground state to emit light. An organic light emitting diode using this principle may be composed of a cathode, an anode, and an organic material layer disposed therebetween, for example, an organic material layer including a hole injection layer, a hole transport layer, a light emitting layer, and an electron transport layer.

The materials used in the organic light emitting diode are mostly pure organic materials or complex compounds in which organic materials and metals form a complex compound, and may be classified into a hole injection material, a hole transport material, a light emitting material, an electron transport material, an electron injection material, and the like according to the use thereof. Here, an organic material having a p-type property, that is, an organic material, which is easily oxidized and electrochemically stable when the material is oxidized, is usually used as the hole injection material or the hole transport material. Meanwhile, an organic material having an n-type property, that is, an organic material, which is easily reduced and electrochemically stable when the material is reduced, is usually used as the electron injection material or the electron transport material. As the light emitting layer material, a material having both p-type and n-type properties, that is, a material, which is stable during both the oxidation and reduction states, is preferred, and when an exciton is formed, a material having high light emitting efficiency for converting the exciton into light is preferred.

There is a need in the art for developing an organic light emitting diode having high efficiency.

CITATION LIST

Non-Patent Documents

Chemical Physics Letters 308 (1999) 317-322

DISCLOSURE

Technical Problem

The present specification has been made in an effort to provide an organic light emitting diode having excellent viewing angle characteristics and excellent color purity.

Technical Solution

The present specification provides an organic light emitting diode including: a transparent electrode; a reflective electrode provided to face the transparent electrode; and one or more organic material layers including a light emitting layer provided between the transparent electrode and the reflective electrode, in which the light emitting layer includes two or more light emitting materials, and a difference between a dipole moment value of one light emitting material in the light emitting materials and a dipole moment value of the other light emitting material is 1.5 Debye or more.

Further, the present specification provides a display device including the above-described organic light emitting diode.

Finally, the present specification provides a lighting device including the above-described organic light emitting diode.

Advantageous Effects

The organic light emitting diode according to an exemplary embodiment of the present specification may increase a full width at half maximum of a light emitting spectrum to improve viewing angle characteristics.

In addition, the organic light emitting diode according to an exemplary embodiment of the present specification may control the color purity of the light emitting spectrum, and thus, it is possible to expect to improve the color rendering index (CRI) when the organic light emitting diode is applied to a lighting device.

Furthermore, as the full width at half maximum is increased and the color purity is controlled, the opportunity to select a host material and/or a material for a dopant included in the light emitting layer is increased. Therefore, it is possible to provide an organic light emitting diode having high light emitting efficiency by using a host and/or a dopant which are/is advantageous for improving the performance of the diode.

DESCRIPTION OF DRAWINGS

FIG. 1 is a view illustrating an organic light emitting diode according to an exemplary embodiment of the present specification.

FIG. 2 is a view illustrating the current density according to the voltage in the organic light emitting diodes of Comparative Examples 1 and 3.

FIG. 3 is a view illustrating the light emitting spectra of the organic light emitting diodes of Comparative Examples 1 and 3.

FIG. 4 is a view illustrating the quantum efficiency according to the current in the organic light emitting diodes of Comparative Examples 1 and 3.

FIG. 5 is a view illustrating the current density according to the voltage in the organic light emitting diodes of Comparative Examples 1 and 2.

FIG. 6 is a view illustrating the light emitting spectra of the organic light emitting diodes of Comparative Examples 1 and 2.

FIG. 7 is a view illustrating the quantum efficiency according to the current in the organic light emitting diodes of Comparative Examples 1 and 2.

FIG. 8 is a view illustrating the light emitting spectra of Comparative Examples 1 and 2 and Example 1.

FIG. 9 is a view illustrating that the light emitting spectra of Comparative Examples 1 and 2 and Example 1 are normalized.

MODE FOR INVENTION

Hereinafter, the present specification will be described in more detail.

When one member is disposed "on" another member in the present specification, this includes not only a case where the one member is brought into contact with another member, but also a case where still another member is present between the two members.

When one part "includes" one constituent element in the present specification, unless otherwise specifically described, this does not mean that another constituent element is excluded, but means that another constituent element may be further included.

The present specification provides an organic light emitting diode including: a transparent electrode; a reflective electrode provided to face the transparent electrode; and one or more organic material layers including a light emitting layer provided between the transparent electrode and the reflective electrode, in which the light emitting layer includes two or more light emitting materials, and a difference between a dipole moment value of one light emitting material in the light emitting materials and a dipole moment value of the other light emitting material is 1.5 Debye or more.

In another exemplary embodiment of the present specification, a difference between a dipole moment value of one light emitting material in the light emitting materials and a dipole moment value of the other light emitting material is 1.5 Debye or more and 10 Debye or less.

When the light emitting layer includes only a light emitting material having a smaller dipole moment value, there occurs a problem in that viewing angle characteristics deteriorate due to the small full width at half maximum (FWHM) when an organic light emitting diode including the light emitting material is applied to a display device. In contrast, when the light emitting layer includes only a light emitting material having a larger dipole moment value, the full width at half maximum is increased, but the color purity may deteriorate.

Further, in the case of an organic light emitting diode including a light emitting material having an appropriate dipole moment value, it may be expected that the full width at half maximum is increased and/or an excellent color purity is obtained, but there is a limitation in selecting a material.

In an exemplary embodiment of the present specification, it is possible to provide an organic light emitting diode which may increase the full width at half maximum and control viewing angle characteristics by including two light emitting materials having different dipole moment values in the light emitting layer. In addition, the organic light emitting diode according to an exemplary embodiment of the present specification may control the full width at half maximum of the light emitting spectrum, and thus, it is possible to expect to improve the color rendering index (CRI) when the organic light emitting diode is applied to a lighting device.

More specifically, as in an exemplary embodiment of the present specification, an organic light emitting diode including two light emitting materials having a difference between the dipole moment values by 1.5 Debye or more may provide excellent color purity while maintaining an increase in full width at half maximum, so that since various light emitting materials may be used, the width of selecting a material is increased, and thus the performance of the organic light emitting diode may be maximized.

In the present specification, "the full width at half maximum" means a width of a distribution corresponding to ½ of a peak of the light emitting spectrum.

In the present specification, "the color purity" means the degree to which one color is reproduced, and as the full width at half maximum is decreased, the color purity may be increased, but the amount of change in brightness according to the viewing angle is increased.

In the present specification, "the viewing angle" means a range in which a screen can be viewed, and in general, in the case of a blue photoluminescence having a narrow full width at half maximum (FWHM), as the width at half maximum is broadened, the viewing angle is improved. As the full width at half maximum (FWHM) of the spectrum is decreased, the color purity is increased, but the amount of change in brightness according to the viewing angle is increased, so that the image quality characteristics deteriorate when the light emitting diode is applied to a display, and accordingly, a spectrum having an appropriate full width at half maximum (FWHM) is required.

For this purpose, it is the most common method to change the dopant, but there is a limitation in selecting a dopant having a desired full width at half maximum (FWHM) while satisfying the efficiency and/or the lifetime, and the like. In order to overcome the limitation, an appropriate color purity may be obtained while improving the color viewing angle characteristics by combining two or more hosts having a large difference between dipole moments to adjust the full width at half maximum (FWHM) of the diode.

In the present specification, "the color rendering index" is an ability to reproduce natural colors, is represented by Ra, and has a value of 0 to 100. The color rendering index indicates an ability of a subject observed under a light source to reproduce color as a numerical value by employing a summer noon sunlight at a temperature of 5,500 K as a standard light (100 Ra), the spectrum of the sunlight has a broad spectrum in a wavelength range in a visible light region, and the broader the full width at half maximum of the organic light emitting diode is, the more advantageous it is to obtain a spectrum similar to the aforementioned spectrum, and a high color rendering index indicates an excellent light source which is close to the actual natural light.

The dipole moment in the present specification is a physical quantity which indicates the degree of polarity, and may be calculated by the following Equation 1.

$$p(r) = \int_V \rho(r_0)(r_0 - r)d^3r_0 \qquad \text{[Equation 1]}$$

$\rho(r_0)$: molecular density $V$: volume $r$: the point of observation $d^3r_0$: an elementary volume The value of the dipole moment may be obtained by calculating the molecular density in Equation 1. For example, the molecular density may be obtained by using a method called Hirshfeld Charge Analysis to obtain a charge and a dipole for each atom and performing the calculation according to the following equations, and the dipole moment may be obtained by substituting the Equation 1 with the calculation result.

Weight Function $$W_\alpha(r) = \rho_\alpha(r - R_\alpha)\left[\sum_p \rho_\beta(r - R_\beta)\right]^{-1}$$

$\rho_\alpha(r - R_\alpha)$: spherically averaged ground-state atomic density $\sum_\beta \rho_\beta(r - R_\beta)$: promolecule density Deformation Density $$\rho_d(r) = \rho(r) - \sum_\alpha \rho_\alpha(r - R_\alpha)$$

$\rho(r)$: molecular density $\rho_\alpha(r - R_\alpha)$: density of the free atom $\alpha$ located at coordinates $R_\alpha$ Atomic Charge $$q(\alpha) = -\int \rho_d(r) W_\alpha(r) d^3 r$$

$W_\alpha(r)$: weight function

In an exemplary embodiment of the present specification, the light emitting layer includes a dopant; and two or more hosts, and a difference between a dipole moment value of one host in the two or more hosts and a dipole moment value of the other host is 1.5 Debye or more.

In an exemplary embodiment of the present specification, the content of the dopant in the light emitting layer is more than 0 wt % and 30 wt % or less based on the total weight, and the content of the two or more hosts is 70 wt % or more and less than 100 wt % based on the total weight.

In another exemplary embodiment, the triplet energy of at least one of the two hosts in the light emitting layer is larger than the triplet energy of the dopant.

In the case of an organic light emitting diode which emits phosphorescent light and in which the triplet energy of at least one of the two hosts in the light emitting layer is larger than the triplet energy of the dopant, excitons produced from the light emitting layer do not move to the host having higher energy, and are limited in the dopant, and as a result, the light emitting efficiency may be higher. Furthermore, in the case of an organic light emitting diode which emits fluorescent light and in which the triplet energy of at least one of the two hosts in the light emitting layer is larger than the triplet energy of the dopant, excitons produced from the light emitting layer remain well in the dopant, so that high light emitting efficiency may be expected because an effect such as triplet triplet annihilation (TTA) or triplet triplet fusion (TTF) may be enhanced.

Accordingly, it is further preferred that the two hosts in the light emitting layer have a larger triplet energy than that of the dopant.

In an exemplary embodiment of the present specification, the dopant may include a phosphorescent dopant or fluorescent dopant. As the phosphorescent dopant and the fluorescent dopant, dopants commonly used in the art may be used.

In an exemplary embodiment of the present specification, the two hosts having a difference between the dipole moment value of the one host and the dipole moment value of the other host by 1.5 Debye or more has a mixed host structure.

In the present specification, the mixed host structure means that two or more host materials are mixed and provided in the light emitting layer.

In an exemplary embodiment of the present specification, a host material having a larger dipole moment value in the two host materials and a host material having a smaller dipole moment value in the two host materials are included at a weight ratio of 1:9 to 9:1.

In an exemplary embodiment of the present specification, the content of the host having a smaller dipole moment value in the two hosts is 10 wt % or more and less than 100 wt % based on the total weight of the hosts, and the content of the host having a larger dipole moment value in the two hosts is more than 0 wt % and 90 wt % or less based on the total weight of the hosts.

In an exemplary embodiment of the present specification, the two hosts having a difference between the dipole moment value of the one host and the dipole moment value of the other host by 1.5 Debye or more have a layer by layer host structure.

In the present specification, the layer by layer host structure means a structure in which two or more host materials each form a layer, and the layers are stacked.

In an exemplary embodiment of the present specification, the layer by layer host structure includes a first host layer and a second host layer, the first host layer includes a host having a larger dipole moment value in the two hosts having a difference between the dipole moment value of the one host and the dipole moment value of the other host by 1.5 Debye or more, the second host layer includes a host having a smaller dipole moment value in the two hosts having a difference between the dipole moment value of the one host and the dipole moment value of the other host by 1.5 Debye or more, and the first host layer is provided to be adjacent to a transparent electrode compared to the second host layer.

In an exemplary embodiment of the present specification, the first host layer and the second host layer may each further include a dopant. In this case, the contents of the dopants included in the first host layer and the second host layer are the same as or different from each other. Further, the kinds of the dopants included in the first host layer and the second host layer are the same as or different from each other. The kinds and contents of the dopants included in the first host layer and the second host layer may be adjusted by the person skilled in the art in terms of the driving voltage, efficiency, and/or lifetime of the diode.

As in an exemplary embodiment of the present specification, a host material having a relatively large dipole moment value emits light with a relatively large wavelength. Accordingly, the first host layer including a host material having a relatively large dipole moment value may be disposed at a position which is relatively distant from a reflective electrode, that is, a metal electrode in the light emitting layer, thereby improving the light emitting efficiency.

In the present specification, being adjacent to the transparent electrode means that the transparent electrode and the first host layer are physically close to each other, and may mean not only the case where the first host layer in the light emitting layer is provided to be brought into contact with the transparent electrode, but also the case where an additional organic material layer is included between the first host layer and the transparent electrode.

In an exemplary embodiment of the present specification, the transparent electrode and the reflective electrode may serve as an anode and a cathode, respectively.

In another exemplary embodiment of the present specification, the transparent electrode and the reflective electrode may serve as a cathode and an anode, respectively.

In an exemplary embodiment of the present specification, the light emitting layer includes a peak wavelength of a photoluminescence spectrum from 420 nm to 480 nm.

In another exemplary embodiment, the light emitting layer includes a peak wavelength of a photoluminescence spectrum from 530 nm to 590 nm.

In the present specification, the peak wavelength means a wavelength at the maximum value in the spectral distribution.

In an exemplary embodiment of the present specification, the organic light emitting diode includes a blue fluorescent light emitting layer.

When the light emitting layer includes the peak wavelength of the photoluminescence spectrum, it is possible to have a wavelength band which may be applied to a display.

In an exemplary embodiment of the present specification, a full width at half maximum of the organic light emitting diode is 1.03 times or larger than a full width at half maximum of an organic light emitting diode including a light emitting layer having a difference between a dipole moment value of one light emitting material in two or more light emitting materials and a dipole moment value of the other light emitting material by less than 1.5 Debye.

In an exemplary embodiment of the present specification, at least one of two light emitting materials having a difference between the dipole moment value of the one light emitting material and the dipole moment value of the other light emitting material by 1.5 Debye or more includes an aromatic ring.

In another exemplary embodiment, both of the two light emitting materials having a difference between the dipole moment value of the one light emitting material and the dipole moment value of the other light emitting material by 1.5 Debye or more include an aromatic ring.

In the present specification, the meaning of including the aromatic ring means not only a case where the aromatic ring is included as a core structure in a compound structure, but also a case where the aromatic ring is included as a substituent.

The aromatic ring of the present specification is not limited to a hydrocarbon ring having an aromatic structure, but may also include a case where the aromatic ring includes one or more heteroatoms instead of a carbon atom.

The hydrocarbon ring in the aromatic ring of the present specification may be an aryl group. When the aryl group is a monocyclic aryl group, the number of carbon atoms thereof is not particularly limited, but is preferably 6 to 25. Specific examples of the monocyclic aryl group include a phenyl group, a biphenyl group, a terphenyl group, and the like, but are not limited thereto.

When the aryl group is a polycyclic aryl group, the number of carbon atoms thereof is not particularly limited, but is preferably 10 to 24. Specific examples of the polycyclic aryl group include a naphthyl group, a triphenylenyl group, an anthracenyl group, a phenanthryl group, a pyrenyl group, a perylenyl group, a chrysenyl group, a fluorenyl group, and the like, but are not limited thereto.

The hetero ring in the aromatic ring of the present specification may be a heteroaryl group.

In the present specification, a heteroaryl group includes one or more of an atom other than carbon, that is, a heteroatom in an aryl group, and specifically, the heteroatom may include one or more atoms selected from the group consisting of O, N, Se, and S, and the like. The number of carbon atoms thereof is not particularly limited, but is preferably 2 to 60. Examples of the heteroaryl group include a thiophene group, a furan group, a pyrrole group, an imidazole group, a triazole group, an oxazole group, an oxadiazole group, a triazole group, a pyridyl group, a bipyridyl group, a pyrimidyl group, a triazine group, a triazole group, an acridyl group, a pyridazine group, a pyrazinyl group, a qinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a benzothiazolyl group, a phenothiazinyl group, a dibenzofuranyl group, and the like, but are not limited thereto.

In the present specification, an alkyl group may be straight-chained or branch-chained, and the number of carbon atoms thereof is not particularly limited, but is preferably 1 to 30. Specific examples thereof include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In an exemplary embodiment of the present specification, the dipole moment value of the light emitting material having a relatively small dipole moment value in two light emitting materials having a difference between the dipole moment value of the one light emitting material and the dipole moment value of the other light emitting material by 1.5 Debye or more may be 1 Debye or less.

In another exemplary embodiment, the light emitting material having a relatively small dipole moment value in two light emitting materials having a difference between the dipole moment value of the one light emitting material and the dipole moment value of the other light emitting material by 1.5 Debye or more may be composed of hydrocarbons or may have a symmetry.

In still another exemplary embodiment, the dipole moment value of the light emitting material having a relatively large dipole moment value in two light emitting materials having a difference between the dipole moment value of the one light emitting material and the dipole moment value of the other light emitting material by 1.5 Debye or more may be 2 Debye or more.

In yet another exemplary embodiment, the light emitting material having a relatively large dipole moment value in two light emitting materials having a difference between the dipole moment value of the one light emitting material and the dipole moment value of the other light emitting material by 1.5 Debye or more may further include a heteroatom and/or a transition metal, or may have an asymmetric structure.

In an exemplary embodiment of the present specification, the light emitting material having a relatively large dipole moment value in two light emitting materials having a difference between the dipole moment value of the one light emitting material and the dipole moment value of the other light emitting material by 1.5 Debye or more includes anthracene.

In an exemplary embodiment of the present specification, the light emitting material having a relatively large dipole moment value in two light emitting materials having a difference between the dipole moment value of the one light emitting material and the dipole moment value of the other light emitting material by 1.5 Debye or more includes anthracene and a hetero ring.

In an exemplary embodiment of the present specification, the light emitting material having a relatively large dipole moment value in two light emitting materials having a difference between the dipole moment value of the one light emitting material and the dipole moment value of the other light emitting material by 1.5 Debye or more includes anthracene and a hetero ring including one or two or more heteroatoms of N, O, and S.

In an exemplary embodiment of the present specification, the light emitting material having a relatively large dipole moment value in two light emitting materials having a difference between the dipole moment value of the one light emitting material and the dipole moment value of the other light emitting material by 1.5 Debye or more includes anthracene; and dibenzofuran, naphthobenzofuran, dibenzothiophene, carbazole, benzocarbazole, xanthene, fluorenone, chromane, benzothiophene, spirofluorenexanthene, and benzimidazophenanthridine, and the dibenzofuran, naphthobenzofuran, dibenzothiophene, carbazole, benzocarbazole, xanthene, fluorenone, chromane, benzothiophene, spirofluorenexanthene, and benzimidazophenanthridine may be additionally substituted with one or two or more substituents selected from the group consisting of an alkyl group and an aryl group.

In an exemplary embodiment of the present specification, the light emitting material having a relatively large dipole moment value in two light emitting materials having a difference between the dipole moment value of the one light emitting material and the dipole moment value of the other light emitting material by 1.5 Debye or more may be selected from the following structures.

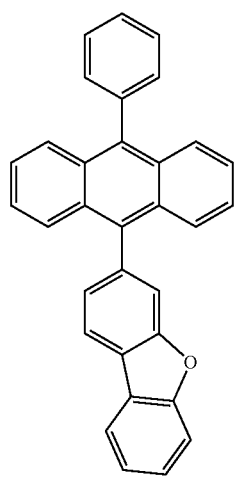

1

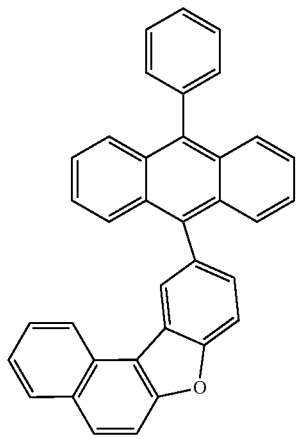

2

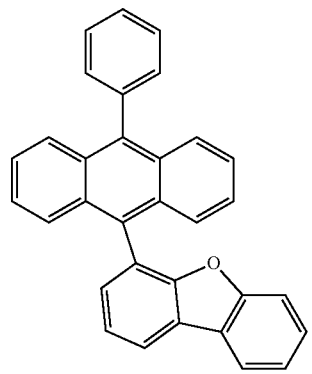

3

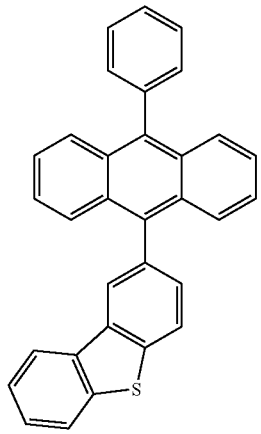

4

5
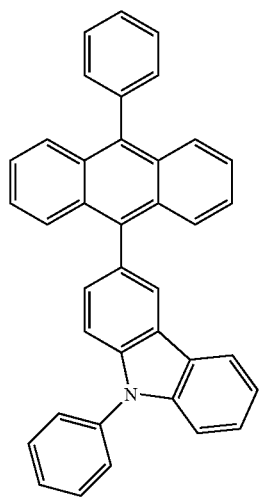
6
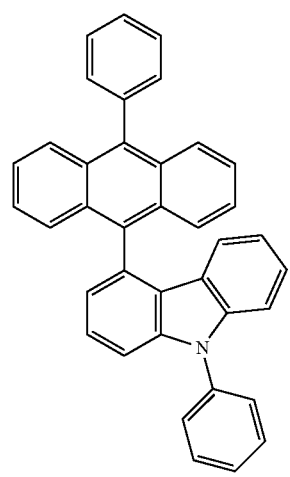
7
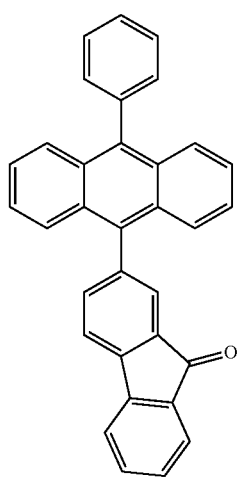
8
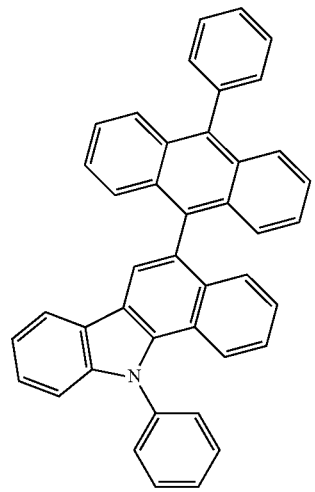
9
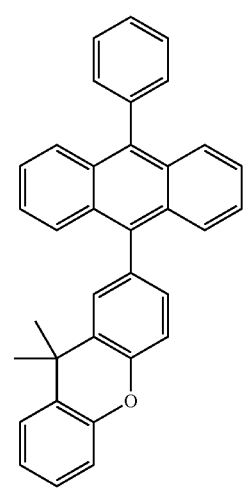
10

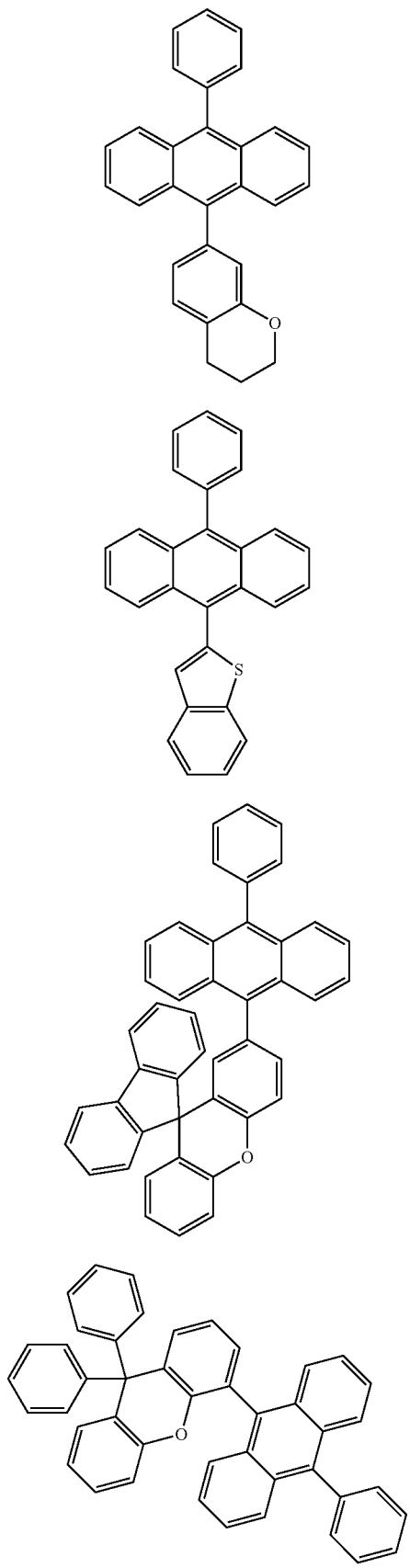

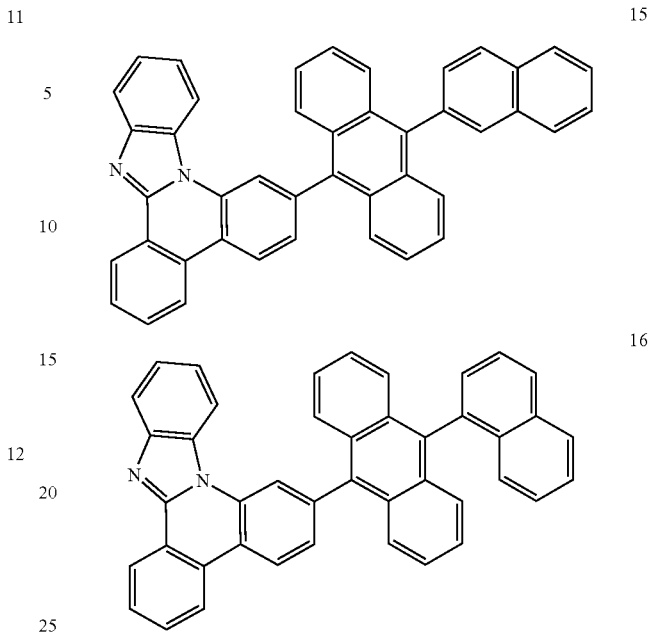

However, in an exemplary embodiment of the present specification, the difference between the dipole moment value of the one light emitting material in the two light emitting materials and the dipole moment value of the other light emitting material is sufficient as long as the difference is 1.5 Debye or more, and the structure, kind, and dipole moment value of the light emitting material are not limited.

The organic light emitting diode of the present specification may be manufactured by materials and methods known in the art, except that the organic light emitting diode includes the above-described two or more light emitting materials, and includes a light emitting layer having a difference between the dipole moment value of the one light emitting material in the light emitting materials and the dipole moment value of the other light emitting material by 1.5 Debye or more.

For example, the organic light emitting diode of the present specification may be manufactured by sequentially stacking an anode, an organic material layer, and a cathode on a substrate. In this case, the organic light emitting diode may be manufactured by depositing a metal or a metal oxide having conductivity, or an alloy thereof on a substrate to form an anode, forming an organic material layer including a hole injection layer, a hole transport layer, an electron blocking layer, a light emitting layer, an electron transport layer, and an electron injection layer thereon, and then depositing a material, which may be used as a cathode, thereon, by using a physical vapor deposition (PVD) method such as sputtering or e-beam evaporation. In addition to the method described above, an organic light emitting diode may be made by sequentially depositing a cathode material, an organic material layer, and an anode material on a substrate. In addition to the method described above, an organic light emitting diode may be made by sequentially depositing an anode material, an organic material layer, and a cathode material on a substrate.

The organic material layer of the organic light emitting diode of the present specification may be composed of a multi-layered structure in which one or more organic material layers are stacked.

In an exemplary embodiment of the present specification, the organic light emitting diode may further include one or two or more layers selected from the group consisting of a hole injection layer, a hole transport layer, an electron transport layer, an electron injection layer, an electron blocking layer, and a hole blocking layer.

For example, the structure of the organic light emitting diode of the present specification may have a structure as illustrated in FIG. 1, but is not limited thereto.

FIG. 1 illustrates the structure of an organic light emitting diode in which a transparent electrode 201, a hole transport layer 301, a light emitting layer 401, an electron transport layer 501, and a reflective electrode 601 are sequentially stacked on a substrate 101. In FIG. 1, a difference between the dipole moment values of at least two light emitting materials among the light emitting materials of the light emitting layer 401 is 1.5 Debye or more.

FIG. 1 is an exemplified structure according to an exemplary embodiment of the present specification, may further include other organic material layers, and may not include other organic material layers.

When the organic light emitting diode includes a plurality of organic material layers, the organic material layers may be formed of the same material or different materials.

As the anode material, a material having a large work function is usually preferred so as to smoothly inject holes into an organic material layer. Specific examples of the positive electrode material which may be used in the present invention include: a metal, such as vanadium, chromium, copper, zinc, and gold, or alloys thereof; a metal oxide, such as zinc oxide, indium oxide, indium tin oxide (ITO), and indium zinc oxide (IZO); a combination of metal and oxide, such as ZnO:Al or $SnO_2$:Sb; an electrically conductive polymer, such as poly(3-methylthiophene), poly[3,4-(ethylene-1,2-dioxy)thiophene] (PEDOT), polypyrrole, and polyaniline, and the like, but are not limited thereto.

As the cathode material, a material having a small work function is usually preferred so as to smoothly inject electrons into an organic material layer. Specific examples of the negative electrode material include: a metal, such as magnesium, calcium, sodium, potassium, titanium, indium, yttrium, lithium, gadolinium, aluminum, silver, tin, and lead, or alloys thereof; a multi-layered structural material, such as LiF/Al or $LiO_2$/Al, and the like, but are not limited thereto.

The hole injection layer is a layer which injects holes from an electrode, and a hole injection material is preferably a compound which has a capability of transporting holes and thus has an effect of injecting holes at a positive electrode and an excellent effect of injecting holes for a light emitting layer or a light emitting material, prevents excitons produced from the light emitting layer from moving to an electron injection layer or an electron injection material, and is also excellent in the ability to form a thin film. It is preferred that the highest occupied molecular orbital (HOMO) of the hole injection material is between the work function of the positive electrode material and the HOMO of a peripheral organic material layer. Specific examples of the hole injection material include metal porphyrin, oligothiophene, an arylamine-based organic material, a hexanitrile hexaazatriphenylene-based organic material, a quinacridone-based organic material, a perylene-based organic material, anthraquinone, a polyaniline and polythiophene-based electrically conductive polymer, and the like, but are not limited thereto.

The hole transport layer is a layer which receives holes from a hole injection layer and transports the holes to a light emitting layer, and a hole transport material is suitably a material which may receive holes transported from a positive electrode or a hole injection layer to transfer the holes to a light emitting layer, and has a large mobility for the holes. Specific examples thereof include an arylamine-based organic material, an electrically conductive polymer, a block copolymer in which a conjugate portion and a non-conjugate portion are present together, and the like, but are not limited thereto.

The light emitting material is preferably a material which may receive holes and electrons from a hole transport layer and an electron transport layer, respectively, and combine the holes and the electrons to emit light in a visible ray region, and has good quantum efficiency to fluorescence or phosphorescence. Specific examples thereof include: an 8-hydroxy-quinoline aluminum complex ($Alq_3$); a carbazole-based compound; a dimerized styryl compound; BAlq; a 10-hydroxybenzoquinoline-metal compound; a benzoxazole, benzthiazole and benzimidazole-based compound; a poly(p-phenylenevinylene) (PPV)-based polymer; a spiro compound; polyfluorene, lubrene, and the like, but are not limited thereto.

The light emitting layer may include a host material and a dopant material. Examples of the host material include a fused aromatic ring derivative, or a hetero ring-containing compound, and the like. Specific examples of the fused aromatic ring derivative include an anthracene derivative, a pyrene derivative, a naphthalene derivative, a pentacene derivative, a phenanthrene compound, a fluoranthene compound, and the like, and specific examples of the hetero ring-containing compound include a carbazole derivative, a dibenzofuran derivative, a ladder-type furan compound, a pyrimidine derivative, and the like, but the examples thereof are not limited thereto.

According to an exemplary embodiment of the present specification, the light emitting layer includes a compound represented by Chemical Formula 1-A.

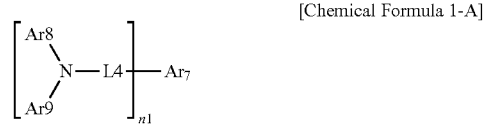

[Chemical Formula 1-A]

In Chemical Formula 1-A, n1 is an integer of 1 or more,

Ar7 is a substituted or unsubstituted monovalent or more benzofluorene group; a substituted or unsubstituted monovalent or more fluoranthene group; a substituted or unsubstituted monovalent or more pyrene group; or a substituted or unsubstituted monovalent or more chrysene group, L4 is a direct bond; a substituted or unsubstituted arylene group; or a substituted or unsubstituted heteroarylene group, Ar8 and Ar9 are the same as or different from each other, and are each independently a substituted or unsubstituted aryl group; a substituted or unsubstituted silyl group; a substituted or unsubstituted germanium group; a substituted or unsubstituted alkyl group; a substituted or unsubstituted arylalkyl group; or a substituted or unsubstituted heteroaryl group, or may combine with each other to form a substituted or unsubstituted ring, and when n1 is 2 or more, two or more structures in the parenthesis are the same as or different from each other.

According to an exemplary embodiment of the present specification, the organic material layer includes a light emitting layer, and the light emitting layer includes the compound represented by Chemical Formula 1-A as a dopant of the light emitting layer.

According to an exemplary embodiment of the present specification, L4 is a direct bond.

According to an exemplary embodiment of the present specification, n1 is 2.

In an exemplary embodiment of the present specification, Ar7 is a divalent pyrene group which is unsubstituted or substituted with deuterium, a methyl group, an ethyl group, or a tert-butyl group.

According to an exemplary embodiment of the present specification, Ar8 and Ar9 are the same as or different from each other, and are each independently a substituted or unsubstituted aryl group having 6 to 30 carbon atoms.

According to an exemplary embodiment of the present specification, Ar8 and Ar9 are the same as or different from each other, and are each independently an aryl group having 6 to 30 carbon atoms, which is unsubstituted or substituted with an alkyl group having 1 to 30 carbon atoms.

According to an exemplary embodiment of the present specification, Ar8 and Ar9 are the same as or different from each other, and are each independently a substituted or unsubstituted heteroaryl group having 2 to 30 carbon atoms.

According to an exemplary embodiment of the present specification, Ar8 and Ar9 are the same as or different from each other, and are each independently a substituted or unsubstituted dibenzofuranyl group.

According to an exemplary embodiment of the present specification, Ar8 and Ar9 are the same as or different from each other, and are each independently an aryl group having 6 to 30 carbon atoms, which is unsubstituted or substituted with a germanium group substituted with an alkyl group having 1 to 30 carbon atoms.

According to an exemplary embodiment of the present specification, Ar8 and Ar9 are the same as or different from each other, and are each independently an aryl group which is unsubstituted or substituted with a trimethylgermanium group.

According to an exemplary embodiment of the present specification, Ar8 and Ar9 are the same as or different from each other, and are each independently a substituted or unsubstituted phenyl group.

According to an exemplary embodiment of the present specification, Ar8 and Ar9 are the same as or different from each other, and are each independently a phenyl group unsubstituted or substituted with a methyl group, or a dibenzofuranyl group.

According to an exemplary embodiment of the present specification, Ar8 and Ar9 are a phenyl group which is unsubstituted or substituted with a trimethylgermanium group.

According to an exemplary embodiment of the present specification, Chemical Formula 1-A is represented by the following compound.

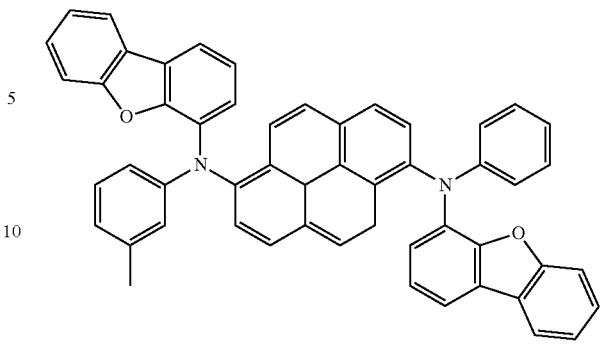

According to an exemplary embodiment of the present specification, the organic material layer includes a light emitting layer, and the light emitting layer includes a compound represented by the following Chemical Formula 2-A.

[Chemical Formula 2-A]

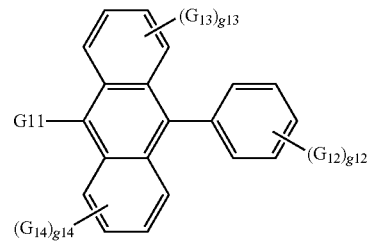

In Chemical Formula 2-A,

G11 is a phenyl group, a 1-naphthyl group, a 2-naphthyl group, a 1-anthryl group, a 2-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 3-methyl-2-naphthyl group, a 4-methyl-1-naphthyl group, or the following Chemical Formula

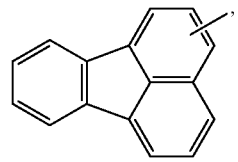

G12 is a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, a 4''-t-butyl-p-terphenyl-4-yl group, or a 3-fluoranthenyl group, G13 and G14 are the same as or different from each other, and are each independently hydrogen; a substituted or unsubstituted alkyl group; a substituted or unsubstituted alkoxy group; a substituted or unsubstituted aryl group; or a substituted or unsubstituted heteroaryl group, g12 is an integer of 1 to 5, g13 and g14 are each an integer of 1 to 4, and when g12 to g14 are each 2 or more, two or more structures in the parenthesis are the same as or different from each other.

According to an exemplary embodiment of the present specification, the organic material layer includes a light emitting layer, and the light emitting layer includes the compound represented by Chemical Formula 2-A as a host of the light emitting layer.

According to an exemplary embodiment of the present specification, G11 is a 1-naphthyl group.

According to an exemplary embodiment of the present specification, G12 is a 2-naphthyl group.

According to an exemplary embodiment of the present specification, G13 and G14 are hydrogen.

According to an exemplary embodiment of the present specification, Chemical Formula 2-A is represented by the following compound.

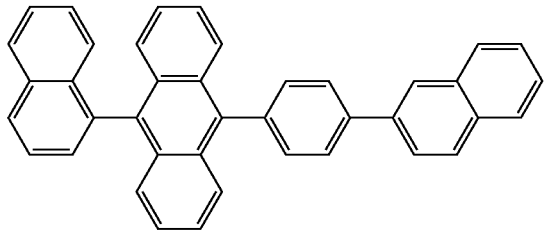

In the fluorescence light emitting layer, as the host material, one or two or more are selected from the group consisting of distyrylarylene (DSA), a distyrylarylene derivative, distyrylbenzene (DSB), a distyrylbenzene derivative, 4,4'-bis(2,2'-diphenyl vinyl)-1,1'-biphenyl (DPVBi), a DPVBi derivative, spiro-DPVBi, and spiro-sexyphenyl (spiro-6P).

In the fluorescence light emitting layer, as the dopant material, one or two or more are selected from the group consisting of styrylamine-based, pherylene-based, and distyrylbiphenyl (DSBP)-based dopant materials.

The electron injection layer is a layer which injects electrons from an electrode, and is preferably a compound which has a capability of transporting electrons, has an effect of injecting electrons from a negative electrode and an excellent effect of injecting electrons into a light emitting layer or a light emitting material, prevents excitons produced from the light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like, but are not limited thereto.

Examples of the metal complex compound include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris(2-methyl-8-hydroxyquinolinato) aluminum, tris(8-hydroxyquinolinato) gallium, bis(10-hydroxybenzo[h]quinolinato) beryllium, bis(10-hydroxybenzo[h]quinolinato) zinc, bis(2-methyl-8-quinolinato) chlorogallium, bis(2-methyl-8-quinolinato)(o-cresolato) gallium, bis(2-methyl-8-quinolinato) (1-naphtholato) aluminum, bis(2-methyl-8-quinolinato)(2-naphtholato) gallium, and the like, but are not limited thereto.

The hole blocking layer is a layer which blocks holes from reaching a negative electrode, and may be generally formed under the same conditions as those of the hole injection layer. Specific examples thereof include an oxadiazole derivative or a triazole derivative, a phenanthroline derivative, bathocuproine (BCP), an aluminum complex, and the like, but are not limited thereto.

The organic light emitting diode according to the present specification may be a top emission type, a bottom emission type, or a dual emission type according to the material to be used.

In addition, the organic light emitting diode according to the present specification may be a normal type in which a lower electrode is an anode and an upper electrode is a cathode, and may also be an inverted type in which a lower electrode is a cathode and an upper electrode is an anode.

The structure according to an exemplary embodiment of the present specification may be operated by a principle, which is similar to the principle applied to an organic light emitting diode, even in an organic electronic diode including an organic solar cell, an organic photoconductor, an organic transistor, and the like.

Hereinafter, the present specification will be described in detail with reference to Examples in order to specifically explain the present specification. However, the Examples according to the present specification may be modified in various forms, and it is not interpreted that the scope of the present specification is not limited to the Examples described below. The Examples of the present specification are provided to more completely explain the present specification to a person with ordinary skill in the art.

Example 1

A glass substrate (Corning 7059 glass) thinly coated with indium tin oxide (ITO) to have a thickness of 1,000 Å was put into distilled water in which a detergent was dissolved, and ultrasonically washed. In this case, a product manufactured by Fischer Co., was used as the detergent, and distilled water twice filtered using a filter manufactured by Millipore Co., was used as the distilled water. After the ITO was washed for 30 minutes, ultrasonic washing was conducted twice repeatedly using distilled water for 10 minutes. After the washing using distilled water was completed, ultrasonic washing was conducted using isopropyl alcohol, acetone, and methanol solvents, and drying was then conducted.

The substrate prepared as described above was subjected to ITO surface treatment for 30 seconds by using a plasma in which oxygen and nitrogen were mixed. Thereafter, the following HAT was vacuum deposited to have a thickness of 100 Å as a hole transport layer on the ITO transparent electrode, and then NPB was vacuum deposited to have a thickness of 1,000 Å as a hole transport layer thereon.

As hosts of the light emitting layer, E1 and E3 were deposited at a weight ratio of 1:1 thereon, and Dopant D1 used in this case was a 4% weight ratio and the thickness of the light emitting layer was 250 Å.

Alq$_3$ was vacuum deposited to have a thickness of 300 Å on the light emitting layer, thereby forming an electron transport layer. Lithium fluoride (LiF) and aluminum were sequentially deposited to have a thickness of 10 Å and 1,000 Å, respectively, on the electron transport layer, thereby forming a cathode.

In the aforementioned process, the deposition rate of the organic material was maintained at 1 to 2 Å/sec except for the dopant. Furthermore, the deposition rates of lithium fluoride and aluminum in the cathode were maintained at 0.1 Å/sec and 1.5 to 2.5 Å/sec, respectively. The degree of vacuum during the deposition was maintained at $1\times10^{-7}$ or less.

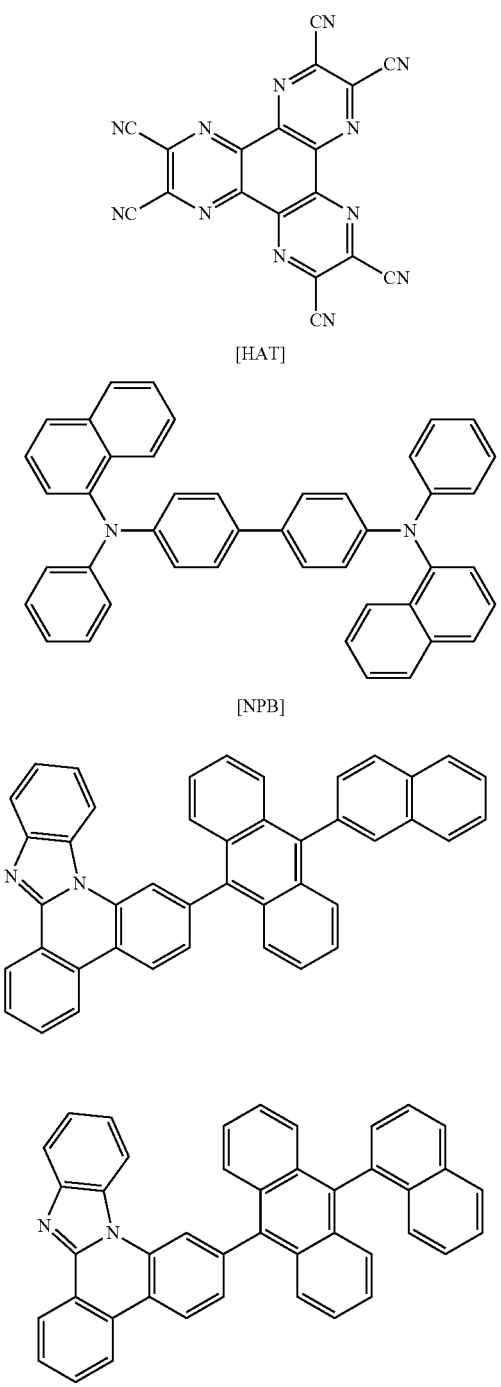

[HAT]

[NPB]

[E1]

[E2]

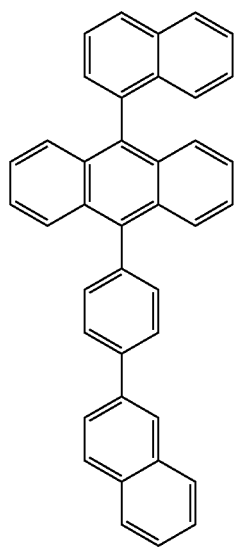

[E3]

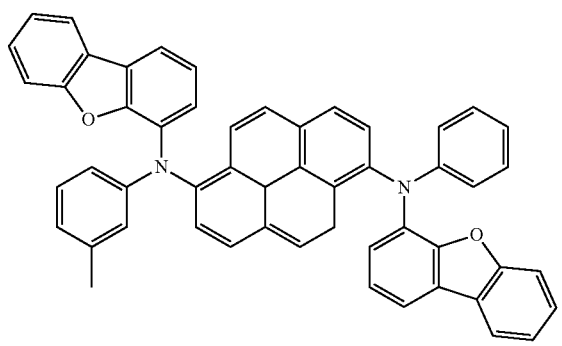 [SMILES: Cc1cccc(N(C2=C3C=Cc4ccc(N(c5ccccc5)c5cccc6c5oc5ccccc56)c5c4C3C(=CC5)C=C2)c2cccc3c2oc2ccccc23)c1]

[D1]

Comparative Example 1

An organic light emitting diode was manufactured in the same manner as in Example 1, except that in Example 1, E3 as a host of the light emitting layer and D1 as a dopant were vacuum deposited at a weight ratio of 4% to have a thickness of 250 Å.

Comparative Example 2

An organic light emitting diode was manufactured in the same manner as in Example 1, except that in Example 1, E1 as a host of the light emitting layer and D1 as a dopant were vacuum deposited at a weight ratio of 4% to have a thickness of 250 Å.

Comparative Example 3

An organic light emitting diode was manufactured in the same manner as in Example 1, except that in Example 1, E2 as a host of the light emitting layer and D1 as a dopant were vacuum deposited at a weight ratio of 4% to have a thickness of 250 Å.

Comparative Example 4

An organic light emitting diode was manufactured in the same manner as in Example 1, except that in Example 1, as hosts of the light emitting layer, E1 and E2 were deposited at a weight ratio of 1:1.

Experimental Example 1

The physical properties of Compounds E1 to E3 are described in the following Table 1.

In the Examples of the present specification, the HOMO level was measured by using an atmospheric pressure photoelectron spectrometer (AC3 manufactured by Riken Keiki Co., Ltd.). Further, for the LUMO energy level, the absorption spectrum (abs.) and photoluminescence spectrum (PL) of the sample prepared above were measured, and then each spectrum edge energy was calculated, the difference was taken as a bandgap (Eg), and the LUMO energy level was calculated as a value obtained by subtracting the bandgap difference from the HOMO energy level measured from the AC-3.

TABLE 1

|  | E1 | E2 | E3 |
| --- | --- | --- | --- |
| HOMO (eV) | 5.84 (cal.) | 5.85 (cal.) | 5.81 |
| LUMO (eV) | 2.76 (cal.) | 2.77 (cal.) | 2.98 |
| Gap (eV) | 3.08 (cal.) | 3.08 (cal.) | 2.83 |
| Dipole moment (Debye) | 3.14 | 2.92 | 0.29 |

Experimental Example 2

From the organic light emitting diodes manufactured by the above-described method, the driving voltage and light emitting efficiency were measured at a current density of 10 mA/cm$^2$, and the results are shown in the following Table 2.

TABLE 2

|  | Voltage (V) | Efficiency (Cd/A) | Quantum efficiency (Q.E) (%) | CIE (x) | CIE (y) | Full width at half maximum | Dipole moment | Δ Dipole moment |
| --- | --- | --- | --- | --- | --- | --- | --- | --- |
| Comparative Example 1 | 3.72 | 7.65 | 8.86 | 0.133 | 0.112 | 42 | 0.29 | — |
| Comparative Example 2 | 3.53 | 9.73 | 8.9 | 0.133 | 0.154 | 45 | 3.14 | — |
| Comparative Example 3 | 3.5 | 9.0 | 9 | 0.133 | 0.140 | 45 | 2.92 | — |
| Comparative Example 4 | 3.5 | 9.5 | 8.9 | 0.133 | 0.146 | 45 | — | 0.22 |
| Example 1 | 3.55 | 8.67 | 8.88 | 0.133 | 0.132 | 47 | — | 2.85 |

As seen in the results in Table 2, it can be confirmed that in the organic light emitting diode including light emitting materials having a difference between at least two dipole moment values by 1.5 Debye or more according to an exemplary embodiment of the present specification, low driving voltage and high light emitting efficiency are maintained, and simultaneously, the color purity is excellent and viewing angle characteristics are improved from the numerical value of the color coordinate and the numerical value of the full width at half maximum.

FIG. 2 is a view illustrating the current density according to the voltage in the organic light emitting diodes of Comparative Examples 1 and 3.

FIG. 3 is a view illustrating the light emitting spectra of the organic light emitting diodes of Comparative Examples 1 and 3.

FIG. 4 is a view illustrating the quantum efficiency according to the current in the organic light emitting diodes of Comparative Examples 1 and 3.

FIG. 5 is a view illustrating the current density according to the voltage in the organic light emitting diodes of Comparative Examples 1 and 2.

FIG. 6 is a view illustrating the light emitting spectra of the organic light emitting diodes of Comparative Examples 1 and 2.

FIG. 7 is a view illustrating the quantum efficiency according to the current in the organic light emitting diodes of Comparative Examples 1 and 2.

FIG. 8 is a view illustrating the light emitting spectra of Comparative Examples 1 and 2 and Example 1.

FIG. 9 is a view illustrating that the light emitting spectra of Comparative Examples 1 and 2 and Example 1 are normalized based on the maximum value (max).

When the results of FIGS. 8 and 9 are compared with each other, it can be confirmed that the case of E1 of which the dipole moment value is relatively large has a large full width at half maximum. However, it can be confirmed that the color purity relatively deteriorates. Further, it can be confirmed that in the case of E3 of which the dipole moment value is relatively small, the full width at half maximum is small, but the color purity is high.

When the organic light emitting diode according to an exemplary embodiment of the present specification includes two or more light emitting materials having a difference between the dipole moment values by 1.5 Debye or more in the light emitting layer, it can be confirmed that the color purity is improved while maintaining an increase in the full width at half maximum, and that the viewing angle is improved.

The invention claimed is:

1. An organic light emitting diode comprising:
   a transparent electrode;
   a reflective electrode provided to face the transparent electrode; and
   one or more organic material layers including a light emitting layer provided between the transparent electrode and the reflective electrode,
   wherein the light emitting layer includes a dopant, a first host, and a second host,
   wherein the dopant comprises a compound represented by the following Chemical Formula 1-A, and
   wherein a difference between a dipole moment value of the first host and a dipole moment value of the second host is 1.5 Debye or more,

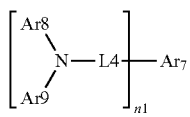

[Chemical Formula 1-A]

in Chemical Formula 1-A, n1 is an integer of 1 or more,

Ar7 is a substituted or unsubstituted monovalent or more benzofluorene group; a substituted or unsubstituted monovalent or more fluoranthene group; a substituted or unsubstituted monovalent or more pyrene group; or a substituted or unsubstituted monovalent or more chrysene group, L4 is a direct bond; a substituted or unsubstituted arylene group; or a substituted or unsubstituted heteroarylene group, Ar8 and Ar9 are the same as or different from each other, and are each independently a substituted or unsubstituted aryl group; a substituted or unsubstituted silyl group; a substituted or unsubstituted germanium group; a substituted or unsubstituted alkyl group; a substituted or unsubstituted arylalkyl group; or a substituted or unsubstituted heteroaryl group, or optionally combine with each other to form a substituted or unsubstituted ring, and when n1 is 2 or more, two or more structures in the parenthesis are the same as or different from each other, wherein a full width at half maximum of a light emission spectra of the organic light emitting diode is 1.03 times or larger than a full width at half maximum of a light emission spectra of another organic light emitting diode that is equivalent to the organic light emitting diode, except comprising a light emitting layer having a difference between a dipole moment value of one host and a dipole moment value of the other host by less than 1.5 Debye.

2. The organic light emitting diode of claim 1, wherein the dopant is present in an amount of more than 0 wt % and 30 wt % or less, based on a total weight of the dopant, the first host and the second host.

3. The organic light emitting diode of claim 1, wherein the first and second hosts have a mixed host structure.

4. The organic light emitting diode of claim 3, wherein the second host is present in an amount of 10 wt % or more and less than 100 wt % based on a total weight of the first and second hosts.

5. The organic light emitting diode of claim 1, wherein the light emitting layer has a layer by layer host structure, wherein the first and second hosts are in separate layers.

6. The organic light emitting diode of claim 5, wherein the layer by layer host structure comprises a first host layer and a second host layer, the first host layer comprises the first host and the dopant,
the second host layer comprises the second host and the dopant,
wherein the first host having a larger dipole moment than that of the second host, and
wherein the first host layer is provided to be adjacent to the transparent electrode compared to the second host layer.

7. The organic light emitting diode of claim 1, wherein a triplet energy of at least one of the first and second hosts is larger than a triplet energy of the dopant.

8. The organic light emitting diode of claim 1, wherein the light emitting layer comprises a peak wavelength of a photoluminescence spectrum from 420 nm to 480 nm.

9. The organic light emitting diode of claim 1, wherein the light emitting layer comprises a peak wavelength of a photoluminescence spectrum from 530 nm to 590 nm.

10. The organic light emitting diode of claim 1, wherein the organic light emitting diode comprises a light emitting layer of blue fluorescent light emission.

11. The organic light emitting diode of claim 1, wherein L4 is a direct bond, Ar7 is a divalent pyrene group, Ar8 and Ar9 are the same as or different from each other, and are each independently an aryl group having 6 to 30 carbon atoms, which is unsubstituted or substituted with an alkyl group having 1 to 30 carbon atoms, or a substituted or unsubstituted heteroaryl group having 2 to 30 carbon atoms, and n1 is 2.

12. The organic light emitting diode of claim 10, wherein the light emitting layer comprises a compound represented by the following Chemical Formula 2-A:

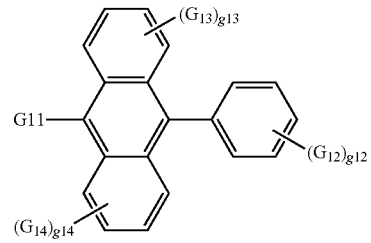

[Chemical Formula 2-A]

in Chemical Formula 2-A,

G11 is a phenyl group, a 1-naphthyl group, a 2-naphthyl group, a 1-anthryl group, a 2-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 3-methyl-2-naphthyl group, a 4-methyl-1-naphthyl group, or the following Chemical Formula

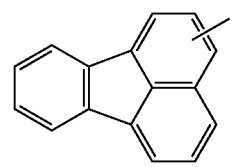

G12 is a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl)

phenyl group, a 3-methyl-2-naphthyl group, a 4-methyl-1-naphthyl group, a 4-methyl-1-anthryl group, a 4'-methylbiphenylyl group, a 4"-t-butyl-p-terphenyl-4-yl group, or a 3-fluoranthenyl group, G13 and G14 are the same as or different from each other, and are each independently hydrogen; a substituted or unsubstituted alkyl group; a substituted or unsubstituted alkoxy group; a substituted or unsubstituted aryl group; or a substituted or unsubstituted heteroaryl group, g12 is an integer of 1 to 5, g13 and g14 are each an integer of 1 to 4, and when g12 to g14 are each 2 or more, two or more structures in the parenthesis are the same as or different from each other.

13. The organic light emitting diode of claim 12, wherein G11 is a 1-naphthyl group, and G12 is a 2-naphthyl group.

14. A display device comprising the organic light emitting diode of claim 1.

15. A lighting device comprising the organic light emitting diode of claim 1.

16. An organic light emitting diode comprising:
a transparent electrode;
a reflective electrode provided to face the transparent electrode; and
one or more organic material layers including a light emitting layer provided between the transparent electrode and the reflective electrode,
wherein the light emitting layer includes a dopant, a first host, and a second host,
wherein a difference between a dipole moment value of the first host and a dipole moment value of the second host is 1.5 Debye or more, and
wherein the light emitting layer comprises a compound represented by the following Chemical Formula 2-A:

[Chemical Formula 2-A]

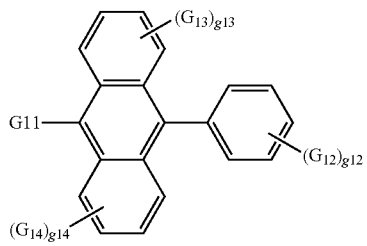

in Chemical Formula 2-A,

G11 is a phenyl group, a 1-naphthyl group, a 2-naphthyl group, a 1-anthryl group, a 2-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 3-methyl-2-naphthyl group, a 4-methyl-1-naphthyl group, or the following Chemical Formula

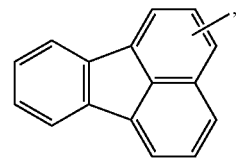

G12 is a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl) phenyl group, a 3-methyl-2-naphthyl group, a 4-methyl-1-naphthyl group, a 4-methyl-1-anthryl group, a 4'-methylbiphenylyl group, a 4"-t-butyl-p-terphenyl-4-yl group, or a 3-fluoranthenyl group, G13 and G14 are the same as or different from each other, and are each independently hydrogen; a substituted or unsubstituted alkyl group; a substituted or unsubstituted alkoxy group; a substituted or unsubstituted aryl group; or a substituted or unsubstituted heteroaryl group, g12 is an integer of 1 to 5, g13 and g14 are each an integer of 1 to 4, and when g12 to g14 are each 2 or more, two or more structures in the parenthesis are the same as or different from each other, wherein a full width at half maximum of a light emission spectra of the organic light emitting diode is 1.03 times or larger than a full width at half maximum of a light emission spectra of another organic light emitting diode that is equivalent to the organic light emitting diode, except comprising a light emitting layer having a difference between a dipole moment value of one host and a dipole moment value of the other host by less than 1.5 Debye.

* * * * *